United States Patent
Funada et al.

(12) 
(10) Patent No.: US 6,232,398 B1
(45) Date of Patent: May 15, 2001

(54) ALKALI OR ACID CORRODIBLE ORGANIC OR COMPOSITE PARTICLES IN RESIN MATRIX

(75) Inventors: Yoshitsugu Funada; Koji Matsui, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/986,104

(22) Filed: Dec. 5, 1997

(30) Foreign Application Priority Data

Dec. 5, 1996 (JP) .................................................. 8-325301

(51) Int. Cl.⁷ ............................ C08L 63/10; C08L 45/00; C08K 9/02

(52) U.S. Cl. .................... 525/107; 523/204; 525/108; 525/142; 525/143; 525/144; 525/165; 525/175; 525/176; 525/177; 525/178; 525/183; 525/210; 525/227; 525/423; 525/425; 525/426; 525/429; 525/432; 525/463; 525/465; 525/466; 525/467; 525/468; 525/480; 525/481; 525/501; 525/502

(58) Field of Search ..................................... 525/107, 108, 525/142, 143, 144, 165, 175, 176, 177, 178, 183, 210, 227, 423, 425, 426, 429, 432, 463, 465, 466, 467, 468, 480, 481, 501, 502; 523/204

(56) References Cited

FOREIGN PATENT DOCUMENTS

| | | |
|---|---|---|
| 50-89439 | 7/1975 | (JP) . |
| 62-41239 | 2/1987 | (JP) . |
| 2-8281 | 1/1990 | (JP) . |
| 2-145616 | 6/1990 | (JP) . |
| 5-70528 | 3/1993 | (JP) . |
| 5-239659 | 9/1993 | (JP) . |
| 6-215623 | 8/1994 | (JP) . |
| 7-179678 | 7/1995 | (JP) . |
| 8-64961 | 3/1996 | (JP) . |
| 8-169982 | 7/1996 | (JP) . |
| 8-510273 | 10/1996 | (JP) . |
| 9-214141 | 8/1997 | (JP) . |
| 10-98271 | 4/1998 | (JP) . |

*Primary Examiner*—Robert E. L. Sellers
(74) *Attorney, Agent, or Firm*—Young & Thompson

(57) ABSTRACT

A resin matrix with resistances to alkali and acid such as a fluorene-containing epoxy acrylate and/or a benzocyclobutene resin includes at least any one of insulative organic particles and insulative composite particles having an organic component and an inorganic component with the total amount of these particles being in the range of 5–50% by volume, wherein the insulative organic particles and the organic component of the insulative composite particles are allowed to be corroded by either alkali or acid, and wherein not less than 90% by volume of the insulative organic particles and insulative composite particles have a particle diameter in the range of 1–20 micrometers.

9 Claims, No Drawings

ALKALI OR ACID CORRODIBLE ORGANIC OR COMPOSITE PARTICLES IN RESIN MATRIX

BACKGROUND OF THE INVENTION

The present invention relates to a resin composition, and more particularly to a resin composition exhibiting a good adhesion when a surface of the resin composition is subjected to a wet processing for forming a conductor on a surface of the molded resin composition.

A plating process has been developed for the purpose of preventing static electricity on the surface of a molded resin composition. This plating process is also made for forming a patterned conductor on a predetermined part of the molded resin composition surface, typically forming a printed wiring board. Such plating processes may be isolated into two processes. The first one is a dry process using thin film technologies of such as evaporation and sputtering. The second one is a wet process, wherein a catalyst core is adsorbed on the resin composition surface, and of the resin composition is subsequently immersed into an electroless plating bath for precipitation of electroless plating. If the dry process is used, then the maximum thickness of the conducive film is only a few micrometers, namely it is difficult to form a thin conductive film. This means that the thick conductive film is formed in the wiring board, then the impedance of the wiring is high, namely it is difficult to reduce the impedance of the conductive film wiring on the wiring board. On the other hand, the dry process allows a good adhesion of conductor with the resin composition. However, the dry process is inferior in the productivity and cost performance, for which reason the dry process is not suitable for mass production at low cost.

Namely, the wet process is superior in cost performance but inferior in adhesion between resin composition and conductor. In order to improve the adhesion between resin composition and conductor, it is required to provide a roughness to the surface of the resin composition. Available methods for providing the roughness to the resin composition surface would be isolated into two typical ones. The first one is the mechanical and physical method. The second one is the chemical method using wet etching by chemical etchants. The mechanical and physical method is somewhat inferior in uniformity of roughness and adhesion to the fine patterns is not uniform. It is also difficult to obtain a sufficiently high adhesion with a hard resin. On the other hand, the chemical method is ineffective with chemical-resistant resins.

Some typical electroless plating processes for resin surface will be described.

Example 1: Co-polymerization of Resin Matrix with Components to be Corroded by Chemicals The following description will be made in the case of acrylonitrile-butadiene-styrene resin (ABS resin). This resin has an island structure wherein the rubber component of butadiene is dispersed in the form of spherical particles in a body of acrylonitrile-butadiene (AB). If this resin is immersed in an oxidizing etchant, then the rubber component in the form of spherical particles positioned in the vicinity of surfaces of the body is selectively oxidized and dissolved into the etchant, whereby the surface of the resin is made rough. The plated film of conductor is securely engaged with the rough surface of the resin by the anchor effect.

It is known in the art to make the adhesive layer rough. In Japanese patent publication Nos. 63-10752 and Japanese laid-open patent publication No. 3-18096, it is disclosed that the rubber component of the acrylonitrile-butadiene-styrene rubbers is introduced into the adhesive of epoxy resins to obtain the same effect as described above.

Chromatic acid is used as an oxidizing etchant for selective etching of the rubber component dispersed in the form of spherical particles. The use of chromatic acid as the oxidizing etchant is not preferable in the light of recently required reduction of environmental pollution. Blending rubber component reduces heat resistivity, stability in size, and insulation performance or anti-migration performance.

Example 2: Blending Resin Matrix with Inorganic Insulator to be Dissolved into Chemicals In Japanese laid-open patent publication No. 60-167492, it is disclosed that an inorganic insulator is used to be selectively etched by chemicals. Glass, magnesium oxide and calcium carbonate are, for example, available to obtain a desired adhesion.

Since such inorganic insulators, however, include alkali metals or alkali earth metals, there is raised a problem with deterioration in moisture resistance of the resin. For this reason, it is preferable to not include a large amount of such inorganic insulators into the resin. Further, generally, the inorganic insulator has a larger specific gravity than resins. Particularly if liquid inorganic insulators such as varnish is used, then the inorganic insulator is non-uniformly present in the resin matrix, and the probability of the inorganic insulator existing in the vicinity of the surface of the resin matrix is lower.

In the above circumstances, it was required to develop a novel resin composition free from the above problems and a novel method of forming a conductor on a surface of the resin component.

SUMMARY OF THE INVENTION

Accordingly, it is an object of the present invention to provide a novel resin composition free from the above problems.

It is a further object of the present invention to provide a novel resin composition on which a conductor fine pattern is adhered at a high adhesion.

It is a still further object of the present invention to provide a novel resin composition having a surface allowing good adhesion to a conductor.

It is yet a further object of the present invention to provide a novel resin composition having good production yield.

It is a further more object of the present invention to provide a novel resin composition which may be produced at a low cost.

It is still more object of the present invention to provide a novel method of forming a conductor on a surface of a resin composition free from the above problems.

It is moreover object of the present invention to provide a novel method of forming a conductor on a surface of a resin composition with good adhesion.

It is another object of the present invention to provide a novel method of forming a conductor on a surface of a resin composition at a low cost.

It is still another object of the present invention to provide a novel, high production yield method of forming a conductor on a surface of a resin composition.

The above and other objects, features and advantages of the present invention will be apparent from the following descriptions.

In accordance with the present invention, a resin matrix with resistances to alkali and acid includes at least any one of insulative organic particles and insulative composite particles having an organic component and an inorganic component at a total amount in the range of 5–50% by volume, wherein the insulative organic particles and the organic component of the insulative composite particles are allowed to be corroded by either alkali or acid, and wherein not less than 90% by volume of any one of the insulative organic particles and insulative composite particles has a particle diameter in the range of 1–20 micrometers.

It is preferable that the insulative organic particles and the organic component of the insulative composite particles comprise a thermoplastic amorphous polymer which has a glass transition temperature of not less than 90° C.

It is also preferable that the insulative organic particles and the organic component of the insulative composite particles comprise a thermoplastic crystal polymer which has a melting point of not less than 110° C.

It is also preferable that the insulative organic particles and the organic component of the insulative composite particles comprise a thermosetting polymer.

It is also preferable that parts of the insulative organic particles and the insulative composite particles comprise hollow particles.

It is also preferable that each of the insulative composite particles comprise inorganic core particles coated with a thermoplastic polymer layer.

It is also preferable that each of the insulative composite particles comprise inorganic core particles coated with a thermosetting polymer layer.

It is also preferable that each of the insulative composite particles comprise a homogeneous organic particle coated with calcium carbonate at an amount of 25% by weight or less.

It is also preferable that each of the insulative composite particles comprise a hollow organic particle coated with calcium carbonate at an amount of 25% by weight or less.

It is also preferable that the resin matrix has a photosensitivity.

It is also preferable that the resin matrix with the photosensitivity is any one of epoxy-acrylate having fluorene skeleton and benzocyclobutene and the organic particles and the organic component of the composite particles are at least one thermoplastic polymer selected from the group consisting of polymethylmethacrylate, polyacrylonitrile, polystyrene, nylon, polycarbonate, and polyvinylidene chloride.

It is also preferable that the resin matrix with the photosensitivity is any one of epoxy-acrylate having flourene skeleton and benzocyclobutene and the organic particles and the organic component of the composite particles are at least one thermosetting polymer selected from the group consisting of epoxy resin, phenol resin, and diarylphthalate resin.

In accordance with the present invention, a method of forming a conductor on a surface of a resin composition comprises the steps of:

molding a resin which includes at least any one of insulative organic particles and insulative composite particles having an organic component and an inorganic component at a total amount in the range of 5–50% by volume, wherein the organic particles and the organic component of the composite particles are allowed to be corroded by either alkali or acid and wherein not less than 90% by volume of said at least any one of said insulative organic particles and said insulative composite particles has a particle diameter in the range of 1–20 micrometers;

exposing the resin to at least any one of an acid solution and an alkali solution to make a surface of the molded resin rough; and subjecting the rough surface of the molded resin to an electroless plating for subsequent heat treatment of the resin.

It is preferable that the acid solution and the alkali solution are permanganate and a neutralizing solution thereof. Permanganate is used as a chemical for desmear treatment.

DISCLOSURE OF THE INVENTION

In accordance with the present invention, a resin matrix has at least any one of resistances to alkali and acid. The resins with the resistance to acid may, for example, be epoxy-acrylate, and polyamide imide. The resins with resistance to alkali may, for example, be polystyrene, and nylon. The resins with resistances to both alkali and acid may, for example, be polypropylene, polyester, epoxy resin, polyimide, and benzocyclobutene. Particularly, epoxy-acrylate having fluorene skeleton and benzocyclobutene are preferable due to those high glass transition temperature and high hydrophobicity. The organic particles and the organic component of the composite particles are allowed to be corroded by either alkali or acid relative to the resin matrix. Thermoplastic polymers may, for example, be selected from polymethylmethacrylate, acryl resins such as polyacrylonitrile, polystyrene, polycarbonate, and acetal resins.

It is preferable that the organic particles and the organic component of the composite particles comprise a thermoplastic amorphous polymer which has a glass transition temperature of not less than 90° C.

It is also preferable that the organic particles and the organic component of the composite particles comprise a thermoplastic crystal polymer which has a melting point of not less than 110° C.

In the method of forming the conductor on the surface of the resin, after the rough surface of the molded resin is subjected to the electroless plating, heat treatment of the resin is carried out to remove moisture from the molded resin for improvement in the adhesion of the surface of the resin. The heat treatment is preferably carried out at not less than 90° C. If the glass transition temperature is less than 90° C., or a melting point is less than 110° C., then any deformation such as expansion may appear on the surface of the molded resin.

If the resin matrix contains a thermoplastic polymer, then the thermoplastic polymer has a glass transition temperature of not less than 90° C., and a melting point of not less than 110° C. If the glass transition and melting point temperatures are lower than the above, then deformation may appear due to heat treatment.

Generally, thermosetting resins have a bridge structure, for which reason the thermosetting resins are superior in resistance to chemicals. It is preferable to not roughen the surface of the resin in a short time. However, if high heat resistance and size stability are required, then those thermosetting resins are superior than the thermoplastic resins. It is, therefore, preferable to blend the thermosetting resins, even if though the time for roughening the surface of the resin is somewhat long. The resin matrix of epoxy-acrylate having fluorene skeleton and benzocyclobutene having a high glass transition temperature is blended with thermosetting resin such as epoxy resin, phenol resin, and diarylphthalate resin to obtain higher properties than when the thermosetting resin is used alone and obtain better adhesion.

On the other hand, the inorganic component of the composite particles is not limited when used as core particles coated with an organic component to be corroded by acid and alkali solutions. In this case, the organic component is corroded, and the core particle is also removed, thereby exhibiting roughness effects. If the inorganic component is used for coating the core particles, then calcium carbonate is preferable due to its high solubility. Since, however, calcium carbonate includes alkali earth metals, the moisture resistance might be dropped. It is preferable to not use a large amount of calcium carbonate alone. It is preferable to reduce the blending amount of calcium carbonate to 25% by weight or less. The hollow particles are effective for shortening the corrosion time and reducing the blending amount thereof. The hollow particles have low specific gravity, and the particles are likely to be localized on the surface region of the particles. This makes it easy to obtain a rough surface on the resin. The blending amount of the particles is in the range of 5–50% by volume. If the blending amount is less than 5% by volume, then it is difficult to obtain the desired rough surface on the resin necessary for good adhesion to the conductor. If the blending amount is more than 50% by volume, then the properties of the resin matrix are remarkably changed. Not less than 90% by volume of the particles have a particle diameter in the range of 1–20 micrometers. Preferably, not less than 95% by volume of the particles have a particle diameter in the range of 3–15 micrometers. More preferably, not less than 98% by volume of the particles have a particle diameter in the range of 5–10 micrometers. If the diameter is less than 1 micrometer, then it is difficult to obtain a sufficiently rough surface on the resin for required adhesion to the conductor. If the diameter is more than 20 micrometers, then the surface roughness is too great to form fine interconnections on the surface.

It is possible to add insulative particles to the resin composition other than the particles to be corroded by alkali and acid solutions. In order to reinforce the molded resin and obtain dimensions stability as well as improve heat conductivity, inorganic particles such as silica, alumina, titanium oxide, and boron nitride may be included. It is also possible to include additives such as flame retardant, coloring agent, ultraviolet ray absorbent agent, antistatic agent.

The chemicals to be used for corrosion are acid and alkali solutions. In view of prevention of environmental pollution, it is preferable to not use organic solvents. For example, mineral acids such as sulfuric acid, and hydrochloric acid may be included, and an oxidizing agent may also be included. As an alkali, sodium hydroxide is generally used. Permanganate is used as a chemical for desmear treatment to remove residual resin to obtain good adhesion for deposition of the electroless plating. The desmear treatment comprises three steps of swelling the resin with an alkali solution containing a small amount of organic solvent, etching by an alkali solution of permanganate, and neutralizing for removal of residual manganese. Therefore, this process may be applicable to either particles to be corroded by any one of acid and alkali solutions. In accordance with the swelling and solubility, the immersion of the resin in the chemicals is carried out for a few minutes to several tens of minutes. In the interval between these immersion processes, the resin needs to be washed by water. Further, it is possible for pre-treatment or post-treatment with alkali solution before or after the desmear treatment.

The method of forming the conductor on the resin surface will be described. The method comprises three steps of molding the resin, making the surface of molded resin rough with at least one of alkali and acid solutions, and subjecting the surface thereof to electroless plating for subsequent heat treatment.

The method of molding is not limited. If the resin matrix is thermoplastic polymer, then it is possible to melt the resin composition to mold the resin in the desired shape. It is also possible to dissolve the resin composition into the solvent to apply on the substrate surface, or to inject into dies for subsequent volatilization. If the resin matrix is the thermosetting polymer or non-thermoplastic polymer, it is possible to apply precursor varnish on the substrate surface for subsequent thermosetting by heat, light and radioactive ray.

The surface of the molded resin is made rough for good adhesion with the electroless plated conductor by use of acid or alkali solutions. Permanganate is used as a chemical for desmear treatment. Further, prior to the desmear treatment, a mechanical polishing such as buff polishing is preferably carried out for obtaining the surface roughness. Particularly, if the surface is hard and the resistance to chemicals is high, the resin thin film is polished for removal thereof to show the particle surface.

The rough surface of the resin is subjected to the electroless plating. In order to carry out the electroless plating, it is required to add to the substrate surface a catalyst causing plating reaction by various methods. As the catalyst, noble metals such as palladium are available. Particularly, palladium of colloidal type is often used. It is also possible to carry out the sensitizing by immersion of the into stannic chloride solution and subsequent activation by immersion into palladium chloride. It is further possible to immerse the into metal salt solution such as copper solution and nickel solution before reduction thereof for deposition of the metal, and subsequent palladium-replacement plating in the palladium chloride solution.

After the catalyst is added, the electroless plating is carried out. Materials for plating are not limited and are selectable in accordance with various uses. If interconnections of the printed wiring board are formed, copper is preferable due to its low cost and low resistance. Nickel and gold are also available. Since the electroless plating is inferior in deposition rate, electroplating may be carried out following the electroless plating.

If the conductive pattern is formed, photo-resist may be used for selective etching of the conductive film. Alternatively, only the necessary part of the conductive film is deposited after addition of the catalyst.

Heat treatment is accomplished for improvement in adhesion between the molded resin surface and the plated film by removal of moisture from the interface between the molded resin surface and the plated film. The heat treatment is preferably carried out at a temperature of not less than 90° C., but not rapidly to prevent expansion of the plated film. Gradual heating is preferable. If a relatively small area pattern is preliminary formed, a rapid heating is also possible due to a sufficient pass for removing moisture.

EXAMPLE 1

100 parts by weight of a varnish available from Shin-Nihon Seitetu and containing 50% by weight of epoxy-acrylate having fluorene skeleton as resin solid component were blended with 20 parts by weight of bridged polymethylmethacrylate particles (M-305, diameter; 5–20 micrometers) available from Matumoto Oils and Fats Pharmaceutical, for subsequent stirring in mixture for 20 minutes to obtain a uniform dispersion of the particles. This varnish of 40 micrometers in thickness was then applied onto an FR-4 unclad plate surface by curtain coater for subsequent pre-baking at 75° C. for 25 minutes before exposure at 500 $mT/cm^2$ prior to a thermosetting at 160° C.

for 30 minutes. A glass transition temperature of the resin after thermosetting was 180° C.

Subsequently, the resin surface was polished by #600 buff to make the surface rough before desmear chemicals were used for swelling, etching, and neutralizing processes.

A solution containing 0.05 mol of copper nitrate was applied to the rough surface for subsequent heat treatment at 150° C. for 3 hours, and oxygen-plasma treatment for 1 minute. Thereafter, particle free epoxy-acrylate varnish having a fluorene skeleton was treated in the same manner a described above until accomplishment of pre-baking processes for exposure through mask pattern and subsequent development with a solution containing 1% by weight of sodium carbonate for 5 minutes.

This substrate was reduced in as solution containing 1 g/l of boron sodium hydride for 10 minutes to deposit metals in the patterns for subsequent washing by water before immersion into electroless copper plating solution KC-500 (available from Japan Energy) for 4 hours to deposit 20 micrometers-thick electroless copper and subsequent heat treatment at 150° C. for 1 hour.

90 degree peel strength test was carried out to confirm a strength of at least 1 kg/cm.

EXAMPLE 2

In place of bridged polymethylmethacrylate particles (M-305, diameter; 5–20 micrometers), nylon 12 particles (orgasole 2001, diameter; 8–12 micrometers, melting point: 175–179° C.) was used. Other conditions are the same as Example 1.

90 degree peel strength test was carried out to confirm a strength of at least 0.9 kg/cm.

EXAMPLE 3

In place of bridged polymethylmethacrylate particles (M-305, diameter; 5–20 micrometers), composite particles of 7–10 micrometers in diameter comprising titanium oxide core particles of 3–5 micrometers in diameter coated with nylon 12 were blended by 25 parts by weight. Other conditions are the same as Example 1.

90 degree peel strength test was carried out to confirm a strength of at least 0.9 kg/cm.

EXAMPLE 4

In place of bridged polymethylmethacrylate particles (M-305, diameter; 5–20 micrometers), phenol resin particles of 13–15 micrometers in diameter were used and the etching process is carried out for twice as long. Other conditions are the same as Example 1.

90 degree peel strength test was carried out to confirm a strength of at least 1 kg/cm.

EXAMPLE 5

100 parts by weight of a photosensitive benzocyclobutene varnish being available from Dow Chemicals was blended with 20 parts by weight of calcium carbonate-treated bridge polymethylmethacrylate particles (M-305C, calcium carbonate/polymethylmethacrylate; 2/8 in percent by weight) for subsequent stirring by mixture for 30 minutes to obtain a uniform dispersion of the particles. An alumina ceramic substrate is applied with 1 wt-% 3-aminopropyltriethoxysilane solution to spin-coat this varnish to a thickness of 10 micrometers thereonto for subsequent pre-baking at 75° C. for 30 minutes before exposure at 700 mT/cm$^2$ prior to a thermosetting at 210° C. for 30 minutes. A glass transition temperature of the resin after thermosetting was 250° C.

Subsequently, the resin surface was polished by #320 buff to make the surface rough for pre-immersion into 20 wt-% hydrochloric acid solution for 15 minutes before desmear chemicals were used for swelling, etching and neutralizing processes.

Palladium catalyst is adsorbed onto the rough surface for activation in the THP process before particle free epoxy-acrylate varnish having fluorene skeleton was treated in the same manner as described above prior to accomplishment of pre-baking processes for exposure through mask pattern, and subsequent development with kerosine for 2 minutes prior to the thermosetting.

This substrate was returned to the THP process for reduction in a solution containing 1 g/l of boron sodium hydride for 10 minutes to deposit metals in the patterns. Subsequent washing by water is accomplished before immersion into electroless copper plating solution KC-500 (available from Japan Energy) for 2 hours to deposit 10 micrometers-thick electroless copper, and subsequent heat treatment at 160° C. for 1 hour.

90 degree peel strength test was carried out to confirm a strength of at least 0.9 kg/cm.

EXAMPLE 6

In place of calcium carbonate-treated bridge polymethylmethacrylate particles (M-305C, diameter; 5–20 micrometers), hollow polyvinylidene particles (F-104E, diameter; 1–2 micrometers) were blended at 5 parts by weight to 15 parts by weight of M-305C. The etching time is reduced by half. Other conditions are the same as Example 5.

90 degree peel strength test was carried out to confirm a strenght of at least 1 kg/cm.

EXAMPLE 7

100 parts by weight of polypropylene resin dried at 90° C. for 1 hour were blended with 40 parts by weight of nylon 6/66 particles dried at 75° C. for 4 hours (diameter; 10–20 micrometers) for subsequent mixing at 190° C. by biaxial extruder to form a chip. This chip was again dried at 90° C. for 1 hour for subsequent injection molding at 190° C. to form a 1.2 mm-thick plate.

Subsequently, the resin surface was polished by #320 buff to make the surface rough before desmear chemicals were used for swelling, etching and neutralizing processes.

Palladium catalyst is adsorbed onto the rough surface for activation in the THP process before electroless plating for 15 minutes to increase the thickness up to 18 micrometers. Hydrochloric acid is used to subsequently provide palladium to deposit electroless nickel plating at 1 micrometer for further flash gold plating. Heat treatment was carried out at 1000° C. for 1 hour.

90 degree peel strength test was carried out to confirm a strength of at least 0.9 kg/cm.

EXAMPLE 8

100 parts by weight of polymethylpentene resin were solved into 500 parts by weight of cyclohexane and then blended with nylon 12 particles (orgasole 2001, diameter; 8–12 micrometers, melting point: 175–179° C.). Other conditions are the same as Example 7.

90 degree peel strength test was carried out to confirm a strength of at least 0.8 kg/cm.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A resin comprising:

a resin matrix comprising at least one of an epoxyacrylate having a fluorene skeleton and benzocyclobutene resin; and said resin matrix containing at least one of insulative organic particles and insulative composite particles, wherein not less than 90 percent by volume of said organic particles and said composite particles have a particle diameter in the range of 1–20 micrometers, and the volume of said at least one of said organic particles and said composite particles is in the range of 5–50 percent of the resin volume, said composite particles having an organic component and an inorganic component, said organic particles and said organic component of said composite particles being corrosible by one of an acid or an alkali, and further wherein said organic particles and said organic component of said composite particles comprise polymethylmethacrylate.

2. The resin of claim 1, wherein each of said composite particles comprise a homogeneous organic particle having a coating of calcium carbonate, the weight of said coating being 25 percent or less of the weight of said homogeneous organic particle.

3. The resin of claim 1, wherein said resin matrix has a photosensitivity.

4. The resin of claim 1, wherein said organic particles and said composite particles comprise hollow particles.

5. The resin of claim 4, wherein said hollow particles each have a coating of calcium carbonate, the weight of said coating being 25 percent or less of the weight of said hollow particle.

6. The resin of claim 1, wherein said inorganic component of said composite particles comprises calcium carbonate.

7. The resin of claim 6, wherein said organic particles and said composite particles comprise hollow particles.

8. The resin of claim 7, wherein said hollow particles each have a coating of calcium carbonate, the weight of said coating being 25 percent or less of the weight of said hollow particle.

9. The resin of claim 6, wherein said resin matrix has a photosensitivity.

* * * * *